United States Patent
Lin et al.

(10) Patent No.: US 11,022,874 B2
(45) Date of Patent: *Jun. 1, 2021

(54) CHROMELESS PHASE SHIFT MASK STRUCTURE AND PROCESS

(71) Applicant: Taiwan Semiconductor Manufacturing Co., Ltd., Hsin-Chu (TW)

(72) Inventors: Yun-Yue Lin, Hsinchu (TW); Hsin-Chang Lee, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/548,273

(22) Filed: Aug. 22, 2019

(65) Prior Publication Data

US 2019/0377255 A1    Dec. 12, 2019

Related U.S. Application Data

(63) Continuation of application No. 15/597,992, filed on May 17, 2017, now Pat. No. 10,394,114.

(Continued)

(51) Int. Cl.
*G03F 1/26* (2012.01)
*G03F 1/38* (2012.01)
(Continued)

(52) U.S. Cl.
CPC .............. *G03F 1/26* (2013.01); *G03F 1/34* (2013.01); *G03F 1/38* (2013.01); *G03F 1/80* (2013.01); *H01L 21/266* (2013.01)

(58) Field of Classification Search
CPC ..... G03F 1/26; G03F 1/34; G03F 1/38; G03F 1/80
See application file for complete search history.

(56) References Cited

U.S. PATENT DOCUMENTS 5,533,634 A    7/1996 Pan et al.
5,576,124 A *  11/1996 Ham ..................... G03F 1/26
                                        430/5
(Continued)

FOREIGN PATENT DOCUMENTS

JP    56-055947    * 5/1981    .............. G03F 1/54
JP    05-289305      11/1993
(Continued)

OTHER PUBLICATIONS

Machine translation of JP 56-055947 (May 1981).*
Machine translation of JP 2008-090254 (Apr. 2008).*

*Primary Examiner* — Martin J Angebranndt
(74) *Attorney, Agent, or Firm* — Haynes and Boone, LLP

(57) ABSTRACT

The present disclosure provides a mask. The mask includes a substrate; an etch stop layer disposed on the substrate, wherein the etch stop layer includes at least one of ruthenium oxide, tungsten nitride, and titanium nitride and is doped with at least one of phosphorous (P), calcium (Ca), and sodium (Na); and a material layer disposed on the etch stop layer and patterned to have an opening, wherein the etch stop layer completely covers a portion of the substrate within the opening.

20 Claims, 9 Drawing Sheets

Related U.S. Application Data

(60) Provisional application No. 62/379,547, filed on Aug. 25, 2016.

(51) Int. Cl.
*G03F 1/34* (2012.01)
*G03F 1/80* (2012.01)
*H01L 21/266* (2006.01)

(56) References Cited

U.S. PATENT DOCUMENTS

| | | |
|---|---|---|
| 5,582,939 A | 12/1996 | Pierrat |
| 5,750,290 A * | 5/1998 | Yasuzato .......... G03F 1/32 430/322 |
| 6,140,755 A | 10/2000 | Neukermans et al. |
| 6,524,755 B2 | 2/2003 | Jin et al. |
| 8,120,114 B2 | 2/2012 | Ott et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,530,728 B2 | 12/2016 | Sung et al. |
| 10,394,114 B2 * | 8/2019 | Lin .......... G03F 1/80 |
| 2001/0051302 A1 | 12/2001 | Dove et al. |
| 2003/0031937 A1 | 2/2003 | Yan |
| 2004/0086788 A1 | 5/2004 | Shiota et al. |
| 2004/0175629 A1 | 9/2004 | Wasson et al. |
| 2004/0229131 A1 * | 11/2004 | Lin .......... G03F 1/36 430/5 |
| 2006/0099517 A1 | 5/2006 | Sugawara |
| 2010/0040961 A1 * | 2/2010 | Shiota .......... G03F 1/32 430/5 |
| 2011/0195349 A1 | 8/2011 | Anderson et al. |
| 2012/0202139 A1 * | 8/2012 | Rankin .......... G03F 1/38 430/5 |
| 2013/0193565 A1 | 8/2013 | Tu et al. |
| 2013/0202992 A1 | 8/2013 | Chen et al. |
| 2015/0286146 A1 | 10/2015 | Chang et al. |
| 2015/0309405 A1 | 10/2015 | Shih et al. |
| 2015/0311075 A1 | 10/2015 | Huang et al. |
| 2017/0153539 A1 * | 6/2017 | Tu .......... G03F 1/80 |

FOREIGN PATENT DOCUMENTS

| | | | |
|---|---|---|---|
| JP | 06-266090 | 9/1994 | |
| JP | 07-098493 | 4/1995 | |
| JP | 07-325383 | 12/1995 | |
| JP | 10-010700 | 1/1998 | |
| JP | 2006-084507 | 3/2006 | |
| JP | 2007-017998 | 1/2007 | |
| JP | 2008-090254 | * 4/2008 | .......... G03F 1/26 |

* cited by examiner

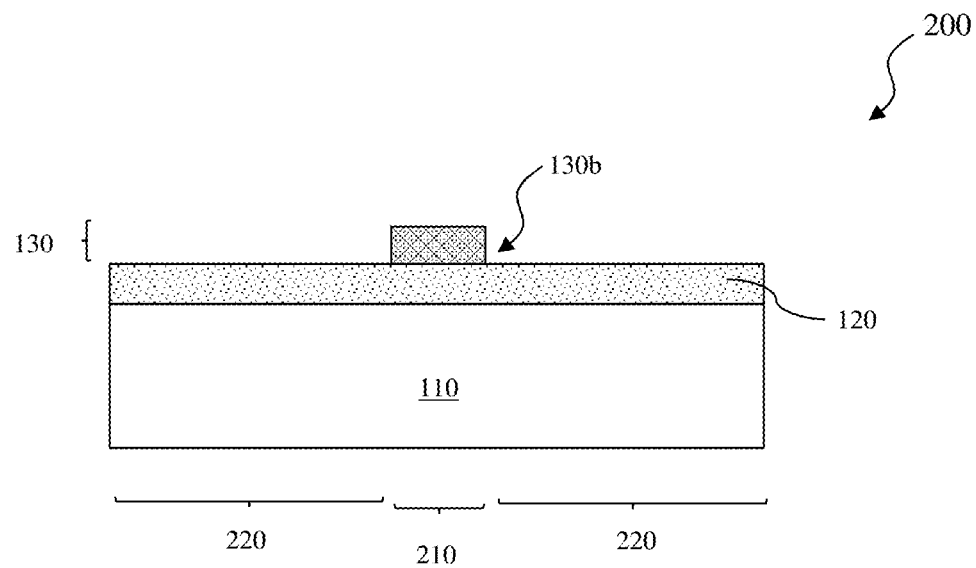
Fig. 6
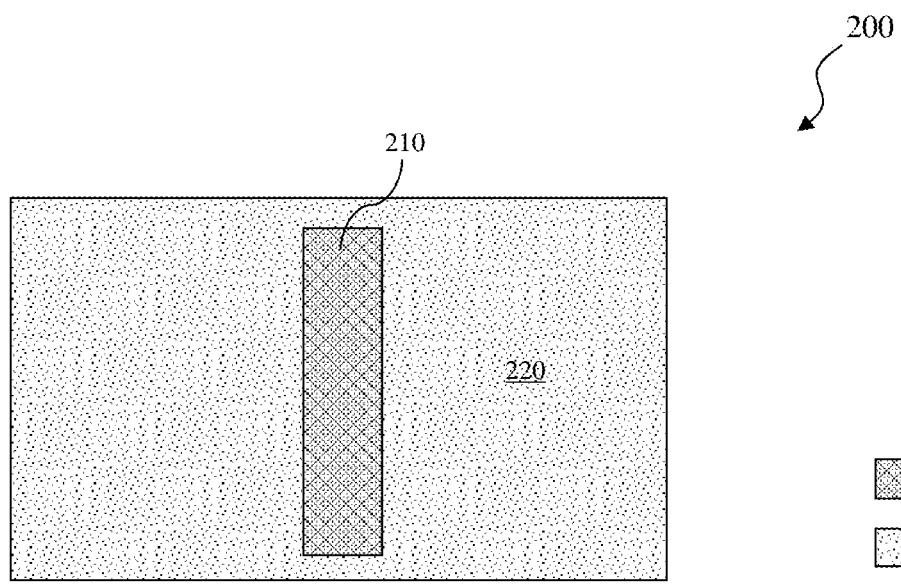
Fig. 7
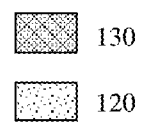

CHROMELESS PHASE SHIFT MASK STRUCTURE AND PROCESS

PRIORITY

This application is a continuation patent application of U.S. patent application Ser. No. 15/597,992, filed May 17, 2017, which further claims the benefit of U.S. provisional application 62/379,547, entitled "CHROMELESS PHASE SHIFT MASK STRUCTURE AND PROCESS," filed Aug. 25, 2016. The entire disclosures of which are incorporated herein by reference.

BACKGROUND

In semiconductor technologies, critical-dimension (CD) variations can be induced by optical interference and other effects. As a result, a mask error factor (MEF) will become too high and unacceptable for smaller feature sizes in sub-wavelength patterning, especially for contact holes. Various techniques have been implemented to improve MEF, including using a phase shift mask (PSM), such as chromeless phase shift mask, to define circuit patterns. In a chromeless phase shift mask, a circuit feature is defined in a transparent mask with phase shift between adjacent transparent regions such that destructive interference generates a dark feature when imaged to a semiconductor substrate. However, a conventional chromeless phase shift mask provides limited freedom to improve imaging quality and other issues, such as etch processing window relative to an expected phase shift. Furthermore, the conventional chromeless phase shift mask has limited protection to the transparent substrate from damage during a process making or using the mask. Therefore, what are needed are a chromeless phase shift mask structure and a method making and using the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6 is a sectional view of a photomask, constructed in accordance with some embodiments.

FIG. 7 is a top view of the photomask in FIG. 6, constructed in accordance with some embodiments.

DETAILED DESCRIPTION

Figure 1:
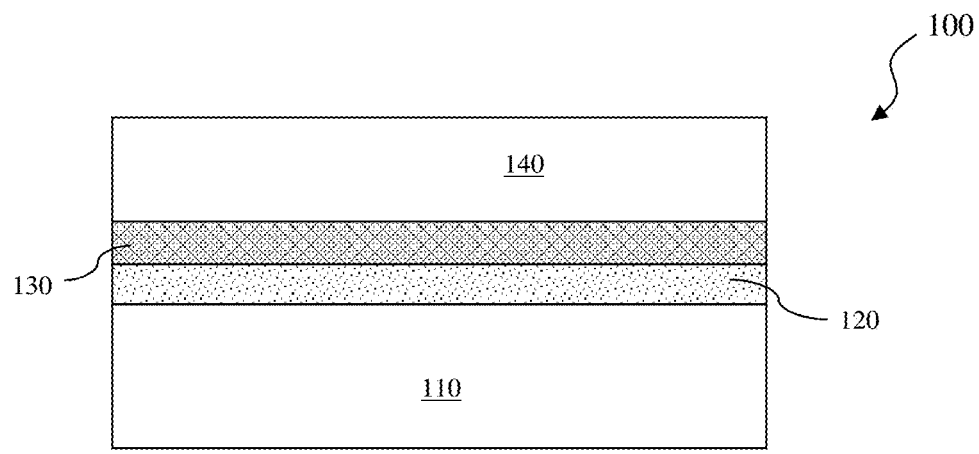
FIGS. 1, 2, 3 and 4 are sectional views of a photomask at various fabrication stages, constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in various examples. This repetition is for the purpose of simplicity and clarity and does not in itself dictate a relationship between the various embodiments and/or configurations discussed.

FIGS. 1 through 4 are sectional views of a photomask (mask, or reticle, collectively referred to as mask) 100 constructed according to aspects of the present disclosure in some embodiments. FIG. 5 is a top view of the mask 100 in FIG. 4 in accordance with some embodiments. Referring to FIGS. 1 through 5, the mask 100 and a method making the same are described. The mask 100 defines a circuit pattern thereon and is used to transfer the circuit pattern to a semiconductor substrate in a lithography process using a radiation beam, such as light radiation. The radiation beam may be ultraviolet and/or can be extended to include other radiation beams such as ion beam, x-ray, extreme ultraviolet (EUV), deep ultraviolet (DUV), and other proper radiation energy. In the following description, the light radiation is used in various examples. The mask 100 is a phase shift mask, particularly a chromeless phase shift mask (CLPSM). Various features on a CLPSM are transparent to the light radiation and are imaged to dark and bright features on the semiconductor substrate through 180° phase shift and corresponding destructive interference. The mask 100 is a CLPSM that defines a feature through phase shift instead of absorption. The mask 100 includes different regions with respective optical phase. The light radiation through different regions of the mask 100 leads to destructive interference and form dark features on the semiconductor substrate. However, the disclosed mask 100 utilizes limited absorption through a phase shift layer or additional attenuating layer to enhance the image quality including resolution and contrast.

Referring to FIG. 1, the mask 100 may be a portion of a mask utilized in manufacturing a semiconductor wafer. The mask 100 includes a transparent substrate 110 (that is transparent to the light radiation), such as fused quartz or fused silica ($SiO_2$) relatively free of defects, calcium fluoride, or other suitable material.

The mask 100 includes an etch stop layer 120 disposed on the transparent substrate 110. The etch stop layer 120 is designed to protect the transparent substrate 110 from damage during a process making or using the mask 100. For example, the etch stop layer 120 is designed with a composition and a thickness to effectively resist an etching or cleaning process applied to the mask 100. The etch stop layer 120 is disposed on the transparent substrate 110 and is not patterned so that it continuously covers a top surface of the transparent substrate 110, as illustrated in FIG. 1.

In one embodiment, the etch stop layer 120 is a ruthenium (Ru) film. In another embodiment, the etch stop layer 120 is a chromium oxynitride film. In some other embodiments, the etch stop layer 120 includes ruthenium, chromium, aluminum, tungsten, silicon, titanium, an oxide thereof, a nitride thereof, an oxynitride thereof, or a combination thereof. The formation of the etch stop layer 120 may include chemical vapor deposition (CVD), physical vapor deposition (PVD), atomic layer deposition (ALD), spin coating, other suitable processes, or a combination thereof. The etch stop layer 120 has a thickness ranging from 0.1 nm to 100 nm in accordance with some embodiments. In some examples, the etch stop layer 120 may have a thickness ranging from 1 nm to 20 nm.

In some other embodiments, the etch stop layer 120 is designed to provide a limited attenuation to the light radiation. The attenuation of the etch stop layer 120 is tuned to enhance the imaging of the mask 100 during a lithography exposure process. In the present embodiment, the etch stop layer 120 is designed with a composition and a thickness to have a transmittance greater than 98% to the radiation beam. The etch stop layer 120 is doped with a proper doping species to tune its transmittance and etching resistance. In some embodiments, in addition to the main composition described as above, the etch stop layer 120 is further doped with a doping species, such as boron (B), phosphorous (P), calcium (Ca), sodium (Na), aluminum (Al), or a combination thereof. For example, the etch stop layer 120 having ruthenium oxide as the main composition is further doped with calcium. In another example, the etch stop layer 120 having tungsten nitride is doped with sodium. In yet another example, the etch stop layer 120 having titanium nitride is doped with boron. The doping process may include ion implantation or in-situ doping, such as a CVD process with the precursor that includes a chemical having the doping species. In various embodiments, the main composition in the etch stop layer 120 has an atomic percentage ranging from 80% to 100%. Accordingly, the doping species in the etch stop layer 120 has an atomic percentage ranging from 0 to 20%.

The mask 100 includes a transparent material layer 130 disposed on the etch stop layer 120 and is to be patterned according to a circuit design layout. The transparent material layer 130 is designed with a composition and a thickness to provide an 180° phase shift to the radiation beam. More specifically, the transparent material layer 130 may have a thickness about $\lambda/[2(n-1)]$, wherein $\lambda$ is the wavelength of the radiation beam projected on the mask 100 during the photolithography process, and n is refractive index of the transparent material layer 130 relative to the radiation beam. Alternatively, the transparent material layer 130 may have a thickness about $m\lambda/[2(n-1)]$, wherein m is an odd integer. In practice, the phase shift is substantially 180° or, in other words, around 180° in a certain range, such as 170° to 190°.

Particularly, the transparent material layer 130 is substantially transparent to the radiation beam and has a limited absorption to the radiation beam. The limited absorption of the transparent material layer 130 is tunable through its composition in a way to enhance the imaging resolution during a lithography exposure process utilizing the mask 100. Therefore, it is also referred to as tunable transparent material layer 130. In the present embodiment, the tunable transparent material layer 130 has a transmittance greater than 90% to the radiation beam. In furtherance of the embodiment, the transmittance is tuned in a range from 90% to 99%.

In some embodiments, the tunable transparent material layer 130 includes silicon oxide doped with carbon or other dopant. The concentration of carbon (or other dopant) can be varied to adjust the transmittance of the tunable transparent material layer 130. In furtherance of the embodiments, both the silicon concentration and the carbon concentration can be varied to adjust the transmittance. In accordance with some examples, the tunable transparent material layer 130 includes silicon with an atomic percentage ranging from 30% to 60%; oxygen with an atomic percentage ranging from 30% to 60%; and carbon with an atomic percentage ranging from 0 to 10%. The tunable transparent material layer 130 may further include an additive, such as nitrogen (N), phosphorous (P), boron (B), or a combination thereof, incorporated therein by ion implantation, in-situ doping or other suitable technique. In some examples, the tunable transparent material layer 130 includes silicon with an atomic percentage ranging from 30% to 60%; oxygen with an atomic percentage ranging from 30% to 60%; carbon with an atomic percentage ranging from 0 to 10%; nitrogen with an atomic percentage ranging from 0 to 5%; phosphorous with an atomic percentage ranging from 0 to 5%; and boron with an atomic percentage ranging from 0 to 5% tuned to have proper transmittance, and accordingly the desired imaging resolution. In other embodiments, the tunable transparent material layer 130, as described as above, may be formed by spin-on glass, CVD or sputtering.

In some embodiments, the tunable transparent material layer 130 includes silicate glass dispersed with chromophore. The concentration of chromophore can be varied to adjust the transmittance of the tunable transparent material layer 130. In some examples, the tunable transparent material layer 130 is formed by spin-on coating and then an annealing process (with an annealing temperature, such as between 130° C. and 150° C.) to cure. In some examples, the tunable transparent material layer 130 is formed by CVD using tetraethylorthosilicate (TEOS) with the formula $Si(OC_2H_5)_4$ or other suitable technique.

In some embodiments, the tunable transparent material layer 130 includes a sol-gel silicate film, formed by a sol-gel process. In some examples, the tunable transparent material layer 130 includes silica gels by a sol-gel polymerization of a proper precursor, such as TEOS, or other suitable chemical. During the sol-gel process, an acid or base catalyst may be used. In some embodiments, the formation of the sol-gel silicate film may include polymerization of TEOS in solution, and sol-gel transition with a catalyst. In some embodiments, the formation of the sol-gel silicate film may include polymerization, hydrolysis and condensation. The sol-gel silicate film is tunable through various parameters to adjust the corresponding transmittance. Various steps and parameters in the process to form the sol-gel silicate film may be varied to adjust the transmittance of the corresponding tunable transparent material layer. For example, the polymerization time may be used to tune the transmittance.

The tunable transparent material layer 130 is patterned according to a circuit design layout. The patterning of the tunable transparent material layer includes lithography process and etching. The lithography process includes coating (such as by spin-on coating) a resist layer 140 on the tunable transparent material layer 130, as illustrated in FIG. 1. In some embodiments, the resist layer 140 may have a tri-layer structure, such as an under layer, a middle layer on the under layer and a photo sensitive layer on the middle layer. In some embodiments, the resist layer 140 may be chemical amplification resist material that includes photo-acid generator. In some embodiments, the resist layer 140 may be positive-tone (wherein the exposed portions will be removed by a developer) or alternatively negative-tone (wherein the unexposed portions will be removed by a developer).

Figure 2:
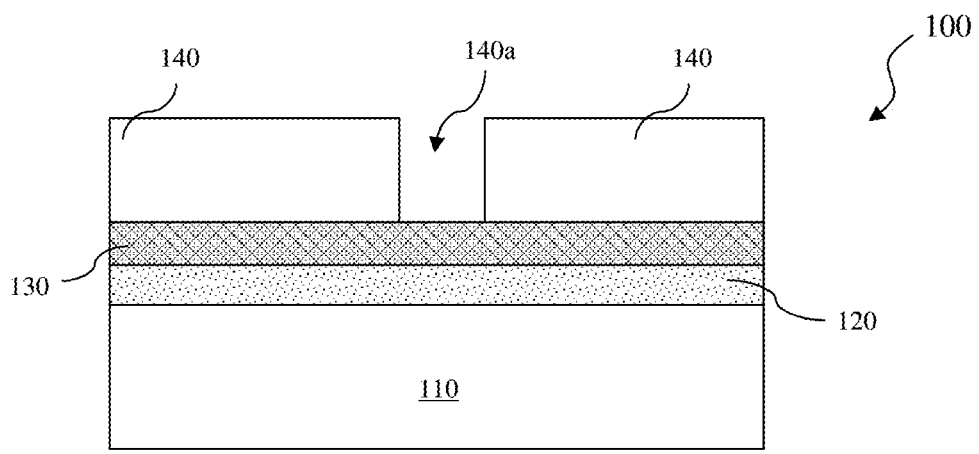

The lithography process further includes exposure and developing, thereby forming a patterned resist layer 140, as illustrated in FIG. 2. The patterned resist layer 140 includes one or more opening 140a such that the tunable transparent material layer 130 is exposed within the opening. The lithography process may further include other steps, such as post-exposure-baking.

Figure 3:
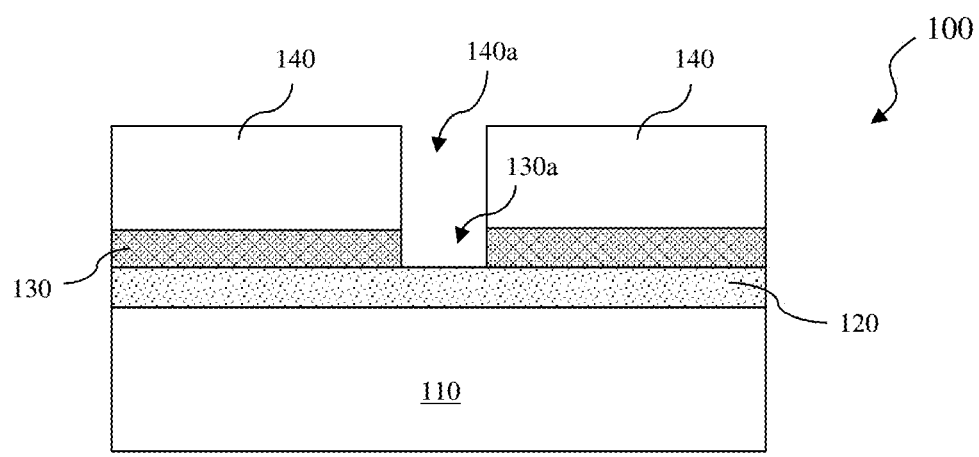

An etching process is further applied to the tunable transparent material layer 130 through the opening 140a of the patterned resist layer 140, using the patterned resist layer as an etch mask. By the etching process, the tunable transparent material layer 130 is patterned. Particularly, the pattern defined in the resist layer 140 is transferred to the tunable transparent material layer 130, as illustrated in FIG. 3. For example, an opening 130a is formed in the tunable transparent material layer 130 after the etching process. The etching process applied to the tunable transparent material layer 130 may include dry etching, wet etching or a combination thereof. For example, the etching process may include a wet etching process using hydroflouric acid as an etchant. In another example, the etching process may include a dry etching process using fluorine-containing plasma as an etchant.

Figure 4:
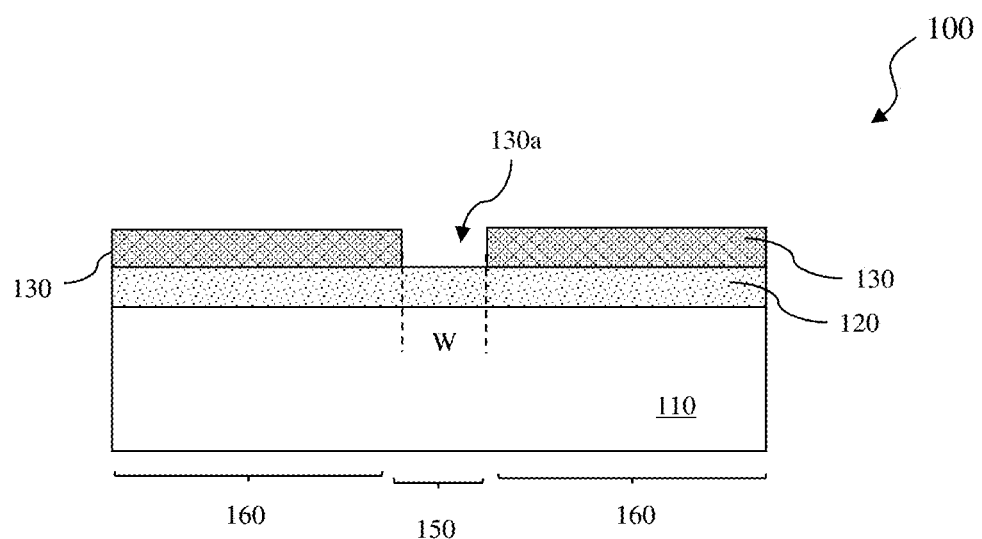
Figure 5:
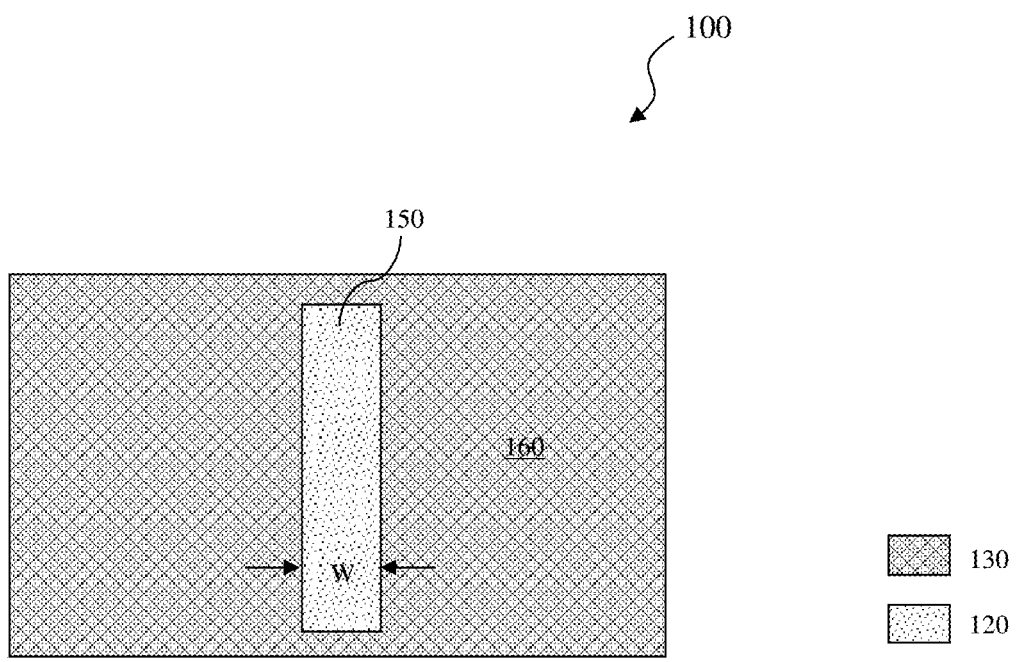
FIG. 5 is a top view of the photomask in FIG. 4, constructed in accordance with some embodiments.

After the etching process, the patterned resist layer 140 is removed by wet stripping or plasma ashing, as illustrated in FIG. 4. Alternatively, a hard mask may be used such that pattern is transferred from the patterned resist layer to the hard mask by a first etch and then transferred to the tunable transparent material layer by a second etch. Since the transparent substrate 110 is protected by the etch stop layer 120, the above etching process and wet stripping (or plasma ashing) will not damage the transparent substrate 110. Otherwise, the damaged substrate may introduce unexpected phase shift, which will degrade the mask 100 and the imaging quality of the lithography exposure process using the mask 100.

Thus formed mask 100 is a chromeless phase shift mask since a circuit feature is defined through phase shift. Especially, in a binary intensity mask, a circuit feature is defined through intensity difference. In other words, a circuit feature in a first region and a second region surrounding the circuit feature on the mask have different transmittances. One of the first and second regions is transparent, and another one of the two regions is opaque. In other types of phase shift mask, a circuit feature is similarly defined through substantial transmittance difference (opaque and transparency) while phase shift increase the contrast and improves the imaging quality. In a chromeless phase shift mask, both the first and second regions are transparent. In the disclosed mask 100, the first and second regions are transparent or substantially transparent (transmittance greater than 90%). As illustrated in FIG. 4, the mask 100 includes a first region 150 and a second region 160. The first region 150 is defined in the opening 130a of the tunable transparent material layer 130 and is free of the tunable transparent material. The second region 160 is the region having the tunable transparent material. The first and second light beams transmitted, respectively, through the first and second regions have a phase shift (substantially 180°). The destructive interference between the first and second light beams generates a dark region corresponding to the opening 130a.

In FIG. 5, a circuit feature is defined by the first region 150. Furthermore, the tunable transparent material layer 130 has a tunable transmittance that is utilized to enhance the resolution of the lithography exposure process. The transmittance tuning is further described in details. The first light beam B1 transmitted through the first region 150. The second light beam B2 transmitted through the second region 160 and a portion B2' of the transmitted second light beam is diffracted to the first region 150. If B1 and B2' are same in intensity, the destructive interference will cancel each other, lead to dark image (zero intensity) of the opening 130a. However, B1 and B2' may not be equal in intensity due to various factors, such as the dimension W of the opening 130a. Therefore, tuning the transmittance of the tunable transparent material layer 130 in a way such that B1 and B2' are matched in intensity. Accordingly, the destructive interference between B1 and B2' generates a dark feature corresponding to the opening 130a with enhanced contrast and resolution. Tuning the transmittance may be implemented, prior to depositing the transparent material layer 130, according to the circuit design layout, such as average feature size of the circuit design layout.

In the mask 100, the etch stop layer 120 is interposed between the transparent substrate 110 and the tunable transparent material layer 130. The etch stop layer 120 covers both the first region 150 and the second region 160, and continuously extends from the first region 150 to the second region 160. The circuit feature is defined in an opening 130a of the tunable transparent material layer 130. In various examples, the circuit feature may be a metal line, a gate, or a fin-like active region.

In some embodiments, a circuit feature may be alternatively defined by an island of the tunable transparent material layer, such as one illustrated in FIGS. 6 and 7. FIG. 6 is a sectional view of a mask 200 and FIG. 7 is a top view of the mask 200, constructed in accordance with some embodiments. A method to form the mask 200 is similar to the corresponding method to form the mask 100. For example, the method includes forming an etch stop layer 120 on a transparent substrate 110; forming a tunable transparent material layer 130; and patterning the tunable transparent material layer 130 according to a circuit design layout. The etch stop layer 120 and the tunable transparent material layer 130 are similar to those of the mask 100 in terms of formation, composition and phase shift. However, the tunable transparent material layer 130 is patterned such that a circuit feature of the circuit design layout is defined by an island 130b of the tunable transparent material layer 130. Especially, the mask 200 includes a first region 210 and a second region 220. The first region 210 is defined in the island 130b of the tunable transparent material layer 130. The second region 220 is free of the tunable transparent material. The radiation beams transmitted respectively through the first and second regions have a phase shift. A circuit feature is defined in the first region 210. Similar to the mask 100, the etch stop layer 120 is interposed between the substrate 110 and the tunable transparent material layer 130. Furthermore, the etch stop layer 120 covers both the first region 210 and the second region 220, and continuously extends from the first region 210 to the second region 220. In various examples, the circuit feature may be a metal line, a gate, or a fin-like active region. The thickness of the tunable transparent material layer 130 may be tuned for enhanced imaging effect of the circuit feature, which is defined by the island 130b of the tunable transparent material layer 130.

Figure 8:
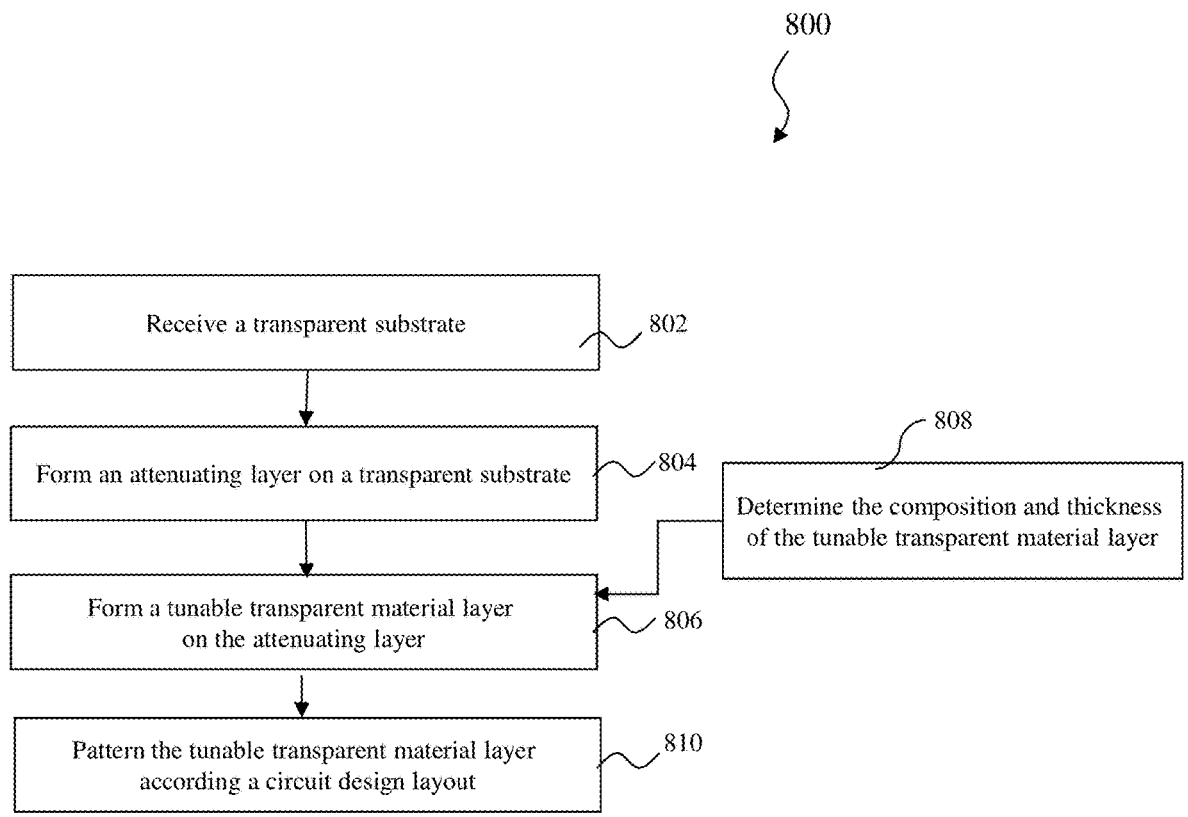
FIG. 8 is a flowchart of a method making a photomask, constructed in accordance with some embodiments.

FIG. 8 is a flowchart of a method 800 for making a chromeless phase shift mask (such as the mask 100 or the mask 200), constructed in accordance with some embodiments. The method 800 may begin at block 802 by receiving a transparent substrate 110, such as fused quartz or other suitable transparent substrate. The method 800 includes an operation 804 by forming an etch stop layer 120 on the transparent substrate 110. In some embodiments, the etch stop layer 120 includes ruthenium or chromium oxynitride. In some embodiments, the etch stop layer 120 includes ruthenium, tungsten, aluminum, silicon, titanium, oxide thereof, nitride thereof, oxynitride thereof, or a combination thereof. The etch stop layer 120 may be formed by PVD, CVD, ALD or other suitable technique.

The method 800 includes an operation 806 by forming a tunable transparent material layer 130 on the etch stop layer 120. In some embodiments, the tunable transparent material layer 130 includes silicon oxide doped with carbon. The concentration of carbon or additionally the concentration of silicon can be varied to adjust the transmittance of the tunable transparent material layer 130. In some embodiments, the tunable transparent material layer 130 includes silicate glass dispersed with chromophore. The concentration of chromophore can be varied to adjust the transmittance of the tunable transparent material layer 130. In various examples, the tunable transparent material layer 130 can be formed by spin-on coating, CVD, or other suitable technique. In some embodiments, the tunable transparent material layer 130 is a sol-gel silicate film, formed by a sol-gel process. For example, the tunable transparent material layer 130 includes silica gels by a sol-gel polymerization of a proper precursor, such as tetraethylorthosilicate (TEOS) with the formula $Si(OC_2H_5)_4$, or other suitable chemical.

Especially, the transmittance is tuned in a way so to enhance the imaging contrast and resolution of the mask during a lithography exposure process. In some embodiments, the method 800 further includes an operation 808 to collectively determine the composition and thickness of the tunable transparent material layer 130 according to the desired phase shift and transmittance, prior to the operation 806 for forming of the tunable transparent material layer 130. As noted above, the thickness is determined according to the desired phase shift (180°), such as using first formula $m\lambda/[2(n-1)]$, while the composition is determined according to attenuation coefficient and thickness of the transparent material layer 130 using second formula, such as Beer-Lambert law $T=e^{-\mu d}$, in which T, μ and are the transmittance, the attenuation coefficient and the thickness of the tunable transparent material layer, respectively. The attenuation coefficient μ may be first determined according to the average feature size of the circuit design layout or according to the engineer experience or manufacturing data. The composition and the thickness are collectively determined based on the above formulas.

Thus, at the operation 806, the tunable transparent material layer 130 with the determined composition is deposited on the etch stop layer 120 to have the determined thickness.

The method 800 also includes an operation 810 by patterning the tunable transparent material layer 130 according to the circuit design layout. The patterning process includes lithography process and etching.

The chromeless phase shift mask and the method making the same are described above, in accordance with various embodiments. Other alternatives and embodiments may present. For example, a chromeless phase shift mask may have a hybrid structure with a combination of the mask 100 and the mask 200. In a hybrid mask, some circuit features are defined by openings of the tunable transparent material layer 130 and some other circuit features are defined by islands of the tunable transparent material layer 130.

An exemplary circuit feature is provided above in the mask 100 or 200. Other features may present or additionally added. For example, one or more dummy features may be added to improve imaging quality of the mask or enhance wafer fabrication. In some embodiments, optical proximity correction (OPC) features may be added for resolution enhancement. One example is described below.

Figure 9:
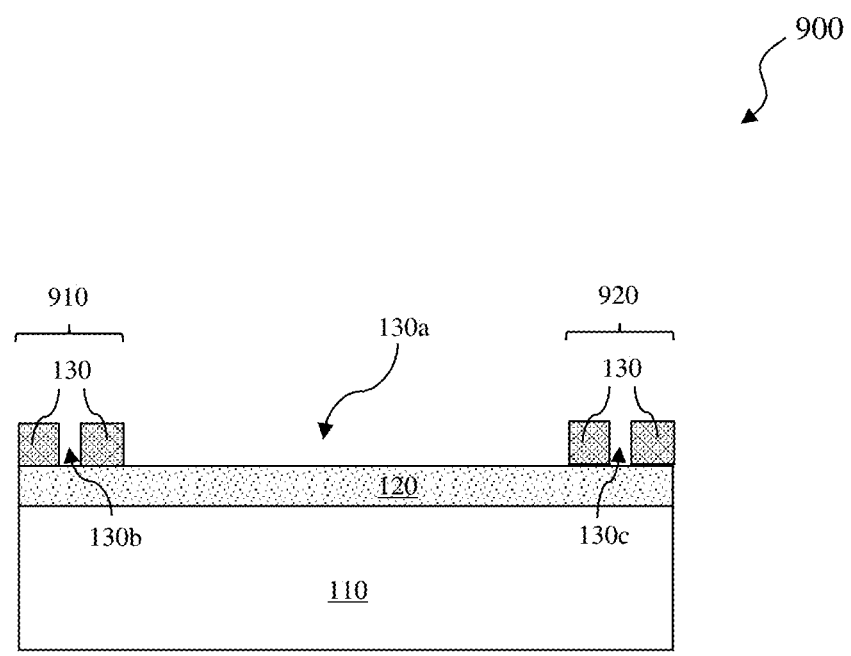
FIG. 9 is a sectional view of a photomask, constructed in accordance with some embodiments.

FIG. 9 is a sectional view of a chromeless phase shift mask 900, constructed in accordance with some embodiments. In the mask 900, the tunable transparent material layer 130 is patterned to form various circuit features 910 and 920. The circuit features 910 and 920 are defined in islands of the tunable transparent material layer 130. Furthermore, an OPC feature 130b is added to the mask 900. In this case, the OPC feature 130b is formed in the circuit feature 910. The OPC feature 130b is a sub-resolution feature with a dimension under the resolution of the lithography exposure process. Therefore, the OPC feature 130b will not be imaged during the lithography exposure process utilizing the mask 900 but the radiation intensity is changed by the OPC feature. Thus, the pattern of the first circuit feature 910 will be image to one dark feature during the lithography exposure process. Similarly, the circuit feature 920 also includes a sub-resolution feature 130c with same mechanism for resolution enhancement.

Figure 10:
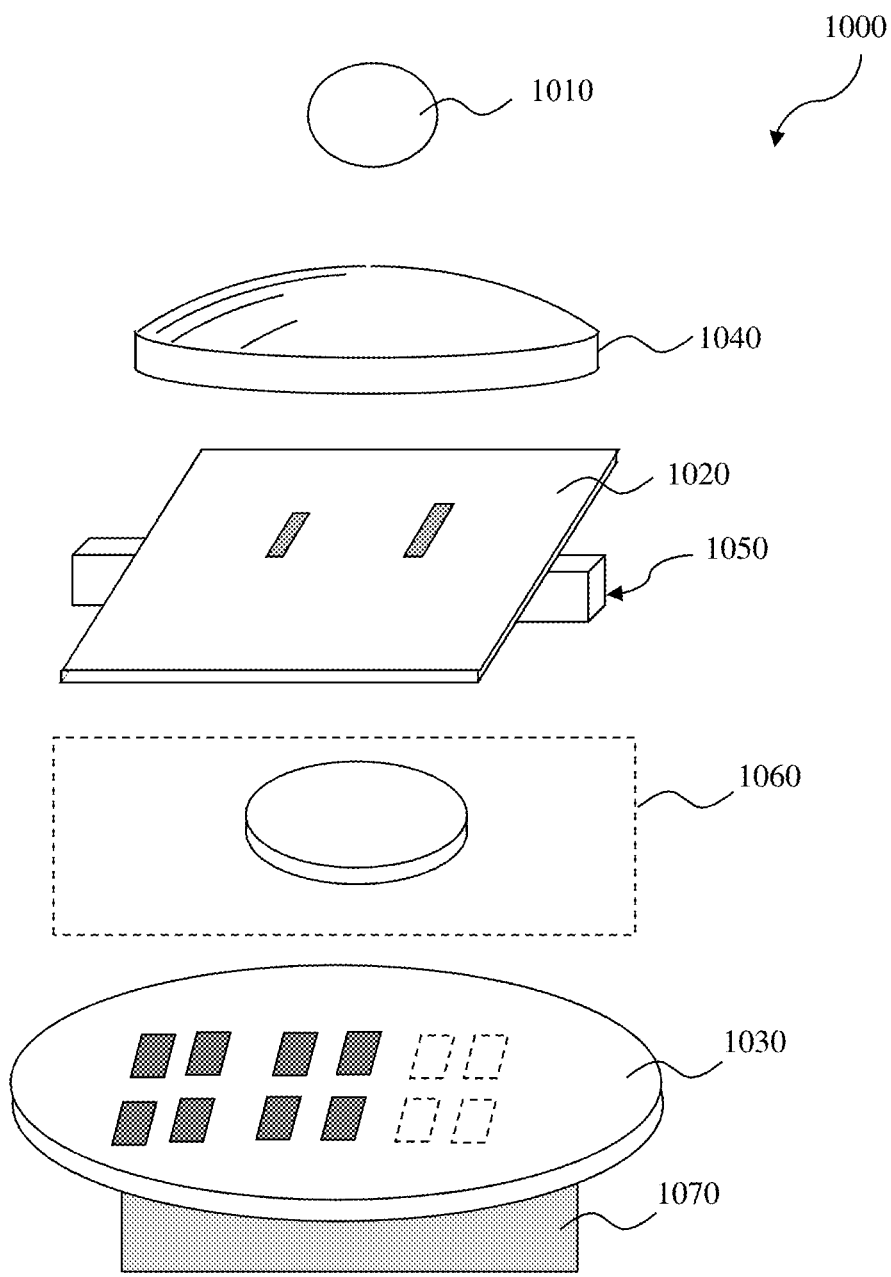
FIG. 10 is a schematic view of a lithography system, constructed in accordance with some embodiments.

FIG. 10 is a schematic view of a lithography system 1000 constructed in accordance with some embodiments. The lithography system 1000 and the disclosed chromeless phase shift mask are used to perform a lithography exposure process to a semiconductor wafer. The lithography system 1000 includes a radiation source 1010 to provide radiation beam. The radiation source 1010 may be any suitable light source. In various embodiments, the radiation source may include ultraviolet (UV) source, deep UV (DUV) source, or other suitable radiation source. For example, the radiation source 1010 may be a mercury lamp having a wavelength of 436 nm (G-line) or 365 nm (I-line); or a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength, such as 13.5 nm.

The lithography system 1000 also includes an optical subsystem that receives the radiation beam from the radiation source 1010, modulates the radiation beam by a mask 1020 and directs the radiation energy to a photoresist layer coated on a semiconductor substrate 1030. In some embodiments, the optical subsystem is designed to have a refractive mechanism. In this situation, the optical subsystem includes various refractive components, such as lenses.

In some particular embodiments, the lithography system 1000 includes an illumination module (e.g., a condenser) 1040. The illumination module 1040 includes a single lens or a lens module having multiple lenses and/or other lens components. For example, the illumination module 1040 may include microlens arrays, shadow masks, and/or other structures designed to aid in directing radiation beam from the radiation source 1010 onto the mask 1020.

The mask 1020 is a chromeless phase shift mask made by the method 800, such as the mask 100, the mask 200, or the mask 900. The mask 1030 is loaded in the lithography system 1000 and secured on a mask stage 1050 of the lithography system 1000. The mask stage 1050 may be designed and configured to be operable for translational and rotational motions.

The lithography system 1000 includes a projection module 1060. The projection module 1060 includes a single lens element or a plurality of lens elements configured to provide proper illumination to the photoresist layer coated on the semiconductor substrate 1030. The illumination module 1040 and the projection module 1060 are collectively referred to as an imaging module (or imaging optics). The imaging lens may further include additional components such as an entrance pupil and an exit pupil configured to image the mask 1020 onto the semiconductor substrate 1030.

The lithography system 1000 may further include a substrate stage 1070 that is capable of securing and moving the semiconductor substrate 1030 in translational and rotational modes so that the semiconductor substrate 1030 can be aligned and scanned during a lithography exposure process.

The semiconductor substrate 1030 is secured by the substrate stage 1070 in the lithography system 1000. A photoresist layer or other radiation-sensitive layer is coated on the semiconductor substrate 1030. In some embodiments, the semiconductor substrate 1030 includes a semiconductor wafer having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof.

The lithography system 1000 may be designed differently according to different characteristics of the radiation source and other factors. In some embodiments where the radiation beam is EUV light, the optical subsystem is designed to have a reflective mechanism. In this situation, the optical subsystem includes various reflective components, such as mirrors. In one example, the radiation source 1010 includes a EUV source having a wavelength around 13.5 nm. Accordingly, the mask 1020 is designed as a reflective mask. In this case, the mask substrate 110 includes a reflective multilayer.

A lithography exposure process is applied to the semiconductor substrate 1030 in the lithography system 1000 utilizing the mask 1020. Since the mask 1020 is a chromeless phase shift mask having the tunable transparent material layer tuned for resolution enhancement, the photoresist layer coated on the semiconductor substrate 1030 is exposed with improved imaging quality. Furthermore, since the mask 1020 is protected by the etch stop layer 120 when making and using the mask, the damages to the mask 1020 are eliminated or substantially reduced.

Figure 11:
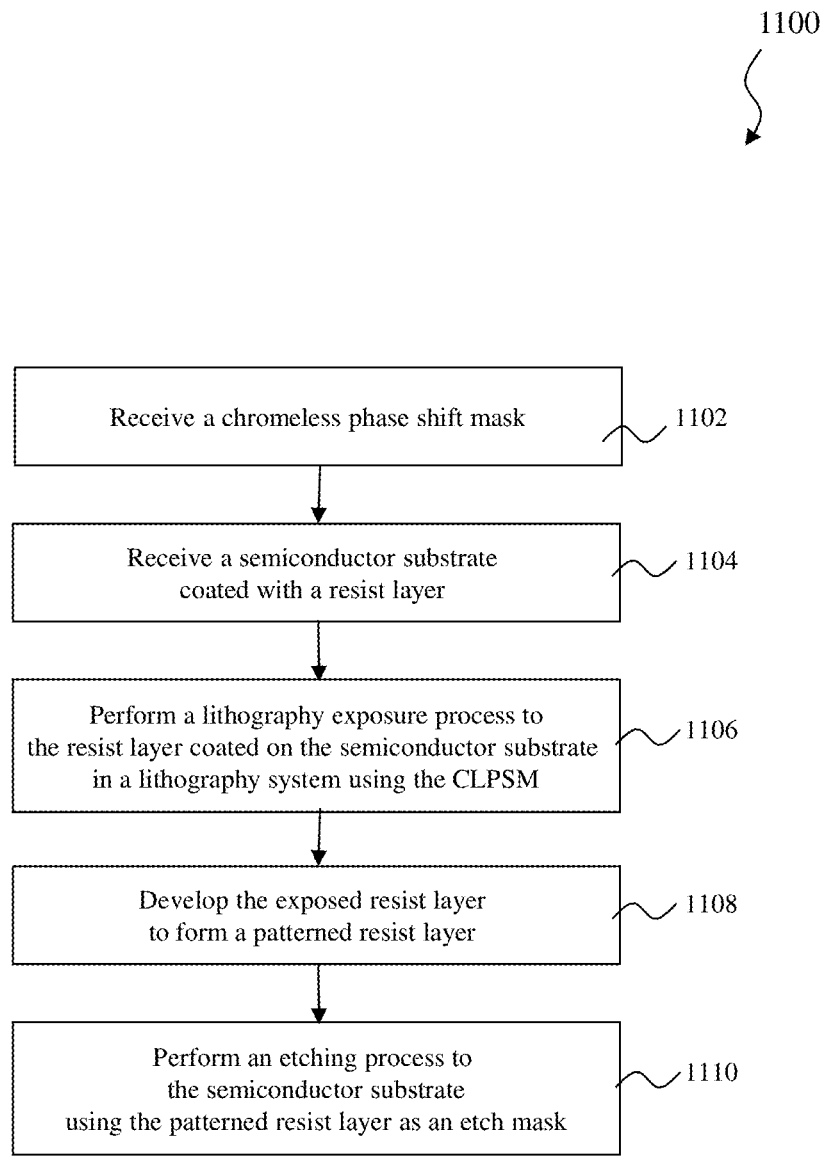
FIG. 11 is a flowchart of a method utilizing a photomask in the lithography system of FIG. 10, constructed in accordance with some embodiments.

FIG. 11 is a flowchart of a method 1100 using a chromeless phase shift mask 1020, constructed in accordance with some embodiments. The method 1100 is described with reference to FIGS. 10 and 11. The method 1100 may begin at block 1102 by receiving the chromeless phase shift mask 1020 and securing the chromesless phase shift mask 1120 on a mask stage 1050 of the lithography system 1000. The method 1100 includes a block 1104 by receiving a semiconductor substrate 1030 and securing the semiconductor substrate 1030 on a substrate stage 1070. The method 1100 also includes an operation 1106 to perform a lithography exposure process to the semiconductor substrate 1030 by the lithography system 1000. During the lithography exposure process, the photoresist layer coated on the semiconductor substrate 1030 is exposed by the radiation beam, which is modulated by the chromeless phase shift mask 1020. The method 1100 may further include other operations. For example, the method 1100 includes an operation 1108 to develop the exposed photoresist layer, thereby forming a patterned photoresist layer. The method 1100 may further include other steps, such as post exposure baking prior to the operation 1108. The method 1100 may also include an operation 1110 to perform an etching process to the semiconductor substrate 1030 using the patterned resist layer as an etch mask. In some embodiments, the operation 1110 may alternatively include an ion implantation process applied to the semiconductor substrate 1030 using the patterned resist layer as an implantation mask.

The present disclosure provides a chromeless phase shift mask, the method making the same, and the method utilizing the same. The chromeless phase shift mask includes an etch stop layer on a transparent substrate and a tunable transparent material layer on the etch stop layer. The tunable transparent material layer is patterned according to a circuit design layout. Furthermore, the tunable transparent material layer is designed to have a tunable transmittance with a composition, such as silicon oxide doped with carbon, silicate glass dispersed with chromophore, or sol-gel silicate. The tunable transparent material layer is designed to provide freedom for transmittance tuning in a proper range, such as a range from 90% to 99%. The etch stop layer includes ruthenium, chromium oxynitride, or other suitable material.

Figure 12:
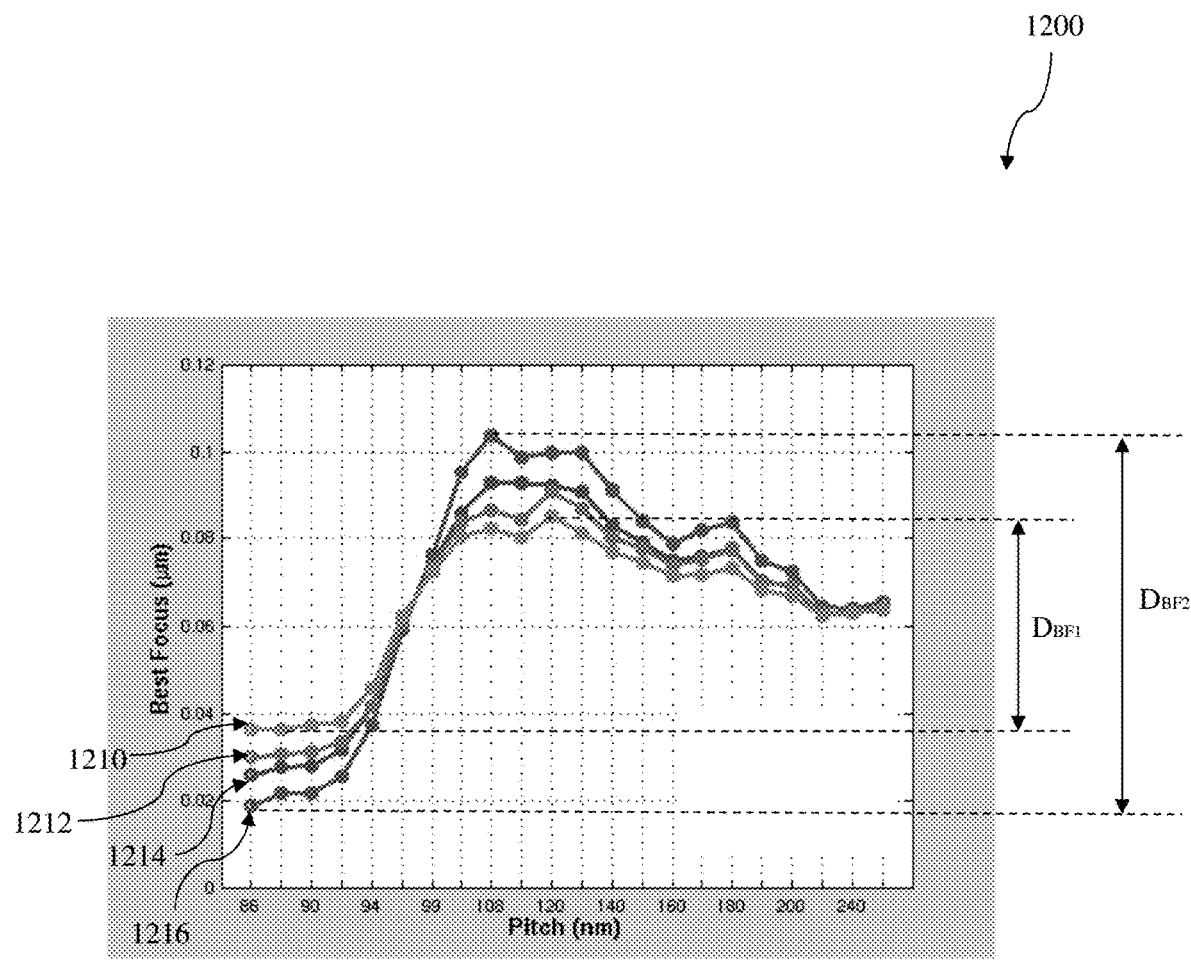
FIG. 12 represents characteristic data of the photomask utilized in the lithography system of FIG. 10, constructed in accordance with some embodiments.

By implementing the disclosed chromeless phase shift mask in various embodiments, some of advantages described below may present. However, it is understood that different embodiments disclosed herein offer different advantages and that no particular advantage is necessarily required in all embodiments. For example, the tunable transparent material layer is designed to provide freedom for tuning the transmittance and enhancing the resolution. The etch stop layer protects the mask from damage during a process making or using the mask. One or more imaging parameter is improved using the disclosed chromeless phase shift mask, such as illustrated in FIG. 12. In FIG. 12, the horizontal axis represents pitch (nm) of a pattern defined on a chromeless phase shift mask and the vertical axis represents best focus (μm) of the mask pattern when being imaged during a lithography process using the chromeless phase shift mask. The data 1210 are from one example of the disclosed chromeless phase shift mask 1020 and the data 1212 are from another example of the disclosed chromeless phase shift mask 1020. The masks respectively associated with the data 1210 and the data 1212 are similar with only different structural parameters, such as different film thicknesses of the etch stop layer 120. Other two sets of data 1214 and 1216 are from various examples of the existing chromeless phase shift mask, which has no any etch stop layer. The data show that, for the disclosed chromeless phase shift mask 1020, the best focus variation over pitch is reduced relative to the existing mask. The best focus variation is defined as the difference between best focus maximum and minimum for the given mask in the given pitch range. For example, as illustrated in FIG. 12, the data 1210 shows that the disclosed exemplary chromeless phase shift mask 1020 has a best focus variation $D_{BF1}$ and the data 1216 shows that the existing exemplary chromeless phase shift mask has a best focus variation $D_{BF2}$, which is greater than $D_{BF1}$. The disclosed mask has better performance that the existing mask in term of the best focus variation. Accordingly, the lithography patterning performance is enhanced by utilizing the disclosed chromeless phase shift mask 1020.

Thus, the present disclosure provides a phase shift mask in accordance with some embodiments. The phase shift mask includes a transparent substrate; an etch stop layer disposed on the substrate; and a tunable transparent material layer disposed on the etch stop layer and patterned to have an opening, wherein the tunable transparent material layer is designed to provide phase shift and has a transmittance greater than 90%.

The present disclosure provides a chromeless phase shift mask (CLPSM), in accordance with some embodiments. The CLPSM includes a transparent substrate having a first region and a second region being adjacent the first region; a tunable transparent material layer disposed over the transparent substrate and patterned to form a transparent feature within the first region and an opening within the second region; and an etch stop layer interposed between the tunable transparent material layer and the transparent substrate, wherein the etch stop layer completely covers the first region and the second region, and continuously extends from the first region to the second region.

The present disclosure also provides a method for integrated circuit fabrication in accordance with some embodiments. The method includes providing a semiconductor substrate; and providing a mask that includes a transparent substrate; an etch stop layer disposed on the substrate; and a tunable transparent material layer disposed on the etch stop layer and patterned according to an integrated circuit pattern, wherein the tunable transparent material layer is designed to provide phase shift and has a transmittance greater than 90%. The method further includes forming the integrated circuit pattern on the semiconductor substrate by utilizing the mask in a lithography process.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A mask, comprising:
   a substrate;
   an etch stop layer disposed on the substrate, wherein the etch stop layer provides a limited attenuation to a light radiation of a lithography process and includes at least one of ruthenium oxide, tungsten nitride, and titanium nitride and is doped with at least one of phosphorous (P), calcium (Ca), and sodium (Na); and
   a substantially transparent material layer disposed on the etch stop layer and patterned to have an opening.

2. The mask of claim 1, wherein the substantially transparent material layer is designed to provide a phase shift and further designed to provide a transmittance greater than 90% to the light radiation.

3. The mask of claim 2, wherein the substantially transparent material layer includes a thickness such that the phase shift is substantially 180 degrees.

4. The mask of claim 1, wherein the substantially transparent material layer is separated from the substrate by the etch stop layer and is designed to provide a transmittance in a range from 90% to 99%.

5. The mask of claim 1, wherein the substantially transparent material layer includes silicon (Si), oxygen (O), carbon (C), nitrogen (N), phosphorous (P), and boron (B).

6. The mask of claim 1, wherein the substantially transparent material layer includes silicate glass dispersed with chromophore.

7. The mask of claim 1, wherein the opening of the substantially transparent material layer defines a circuit feature of a circuit design layout, and wherein the etch stop layer completely covers a portion of the substrate within the opening.

8. The mask of claim 1, wherein the etch stop layer provides a transmittance greater than 98% to the light radiation.

9. The mask of claim 1, wherein the at least one of phosphorous (P), calcium (Ca), and sodium (Na) distribute throughout the etch stop layer.

10. The mask of claim 1, wherein the material layer is patterned to further include an island that defines a circuit feature of a circuit design layout, wherein the island further includes a through-opening that has a sub-resolution dimension.

11. The mask of claim 1, wherein the etch stop layer is doped with calcium (Ca) or sodium (Na).

12. A mask, comprising:
    a transparent substrate having a first region and a second region being adjacent the first region;
    a material layer substantially transparent and disposed over the transparent substrate and patterned to form a transparent feature within the first region and an opening within the second region; and
    an etch stop layer interposed between the material layer and the transparent substrate, wherein the etch stop layer includes at least one of ruthenium oxide, tungsten nitride, and titanium nitride and is doped with at least one of phosphorous (P), calcium (Ca), and sodium (Na),
    wherein the transparent substrate, the material layer, and the etch stop layer collectively provides a transmittance greater than 90% to a light radiation of a lithography process.

13. The mask of claim 12, wherein:
    the etch stop layer extends continuously from the first region to the second region;
    one of the transparent feature and the opening defines a circuit feature to be imaged on a semiconductor substrate using the light radiation;
    the transparent feature has a transmittance larger than 90% to the light radiation; and
    the material layer has a thickness and composition to provide a phase difference of about 180° between a first beam of the light radiation transmitted through the mask within the first region and a second beam of the light radiation transmitted through the mask within the second region during a lithography process.

14. The mask of claim 12, wherein
    the transparent substrate includes fused quartz; and
    the material layer includes a material selected from the group consisting of silicon oxide doped with carbon, silicate glass dispersed with chromophore and sol-gel silicate.

15. The mask of claim 12, wherein the material layer includes silicon (Si), oxygen (O), carbon (C), nitrogen (N), phosphorous (P), and boron (B).

16. The mask of claim 12, wherein the material layer includes silicon at an atomic percentage between 30% and 60%, oxygen at an atomic percentage between 30% and 60%, and carbon at an atomic percentage below 10%, and wherein the etch stop layer includes tungsten nitride doped with sodium (Na).

17. The mask of claim 12, wherein the etch stop layer includes at least one of titanium nitride doped with boron (B), and tungsten nitride doped with sodium (Na).

18. The mask of claim 12, wherein the etch stop layer provides a transmittance greater than 98% to the light radiation.

19. A method for integrated circuit fabrication, comprising:
    providing a semiconductor substrate;
    providing a photoresist layer over the semiconductor substrate;
    providing a mask that includes
       a substrate;
       an etch stop layer disposed on the substrate, wherein the etch stop layer includes at least one of ruthenium oxide, tungsten nitride, and titanium nitride and is doped with at least one of phosphorous (P), calcium (Ca), and sodium (Na), the etch stop layer providing a transmittance greater than 98% to a light radiation; and a material layer disposed on the etch stop layer and patterned according to an integrated circuit pattern; and forming the integrated circuit pattern on the semiconductor substrate by utilizing the mask in a lithography process including:

performing a lithography exposure process to the semiconductor substrate utilizing the mask and the light radiation; and developing the exposed photoresist layer.

20. The mask of claim 19, wherein the material layer absorbs less than about 10% of the light radiation.

* * * * *